April 6, 1965 N. E. BROWN 3,177,377
AUTOMATIC SIGNAL LEVEL DISCRIMINATOR
Filed Nov. 29, 1961
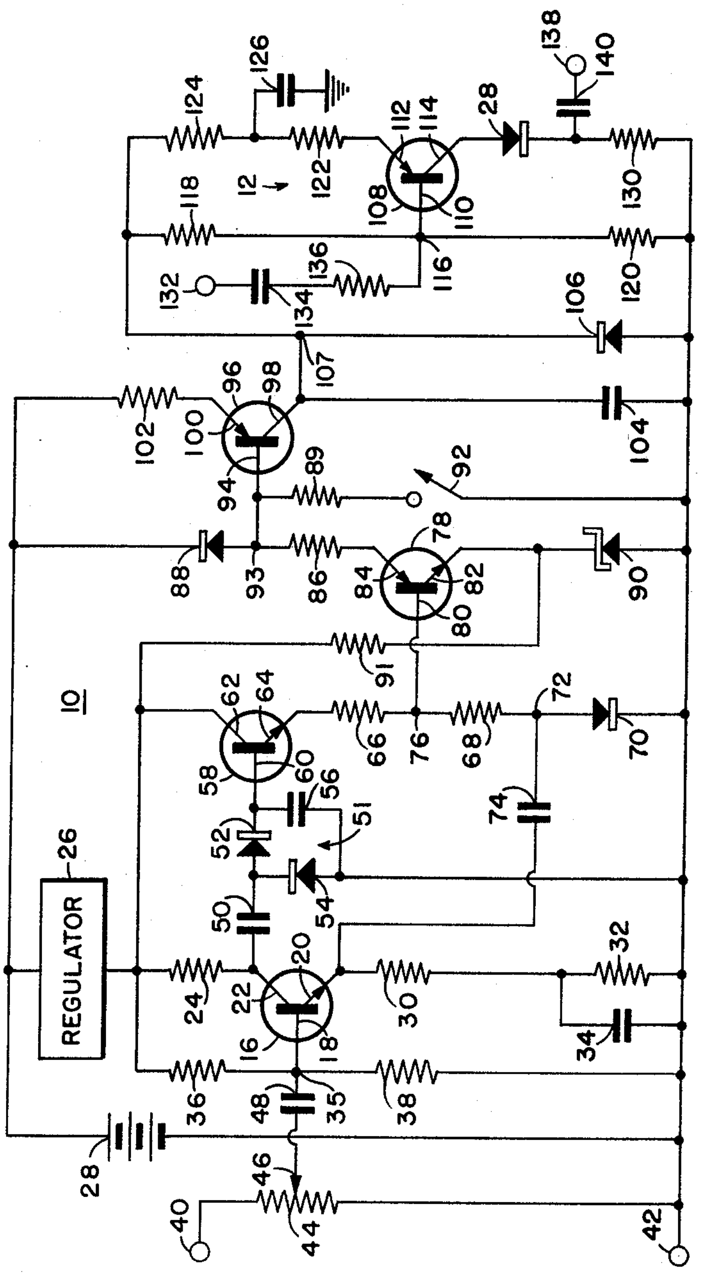
INVENTOR.
NOEL E. BROWN.
BY Alden D. Redfield
Irwin P. Garfinkle
ATTORNEYS.

United States Patent Office 3,177,377 Patented Apr. 6, 1965

3,177,377

AUTOMATIC SIGNAL LEVEL DISCRIMINATOR

Noel E. Brown, Cincinnati, Ohio, assignor to Avco Corporation, Cincinnati, Ohio, a corporation of Delaware Filed Nov. 29, 1961, Ser. No. 155,646
15 Claims. (Cl. 307—88.5)

This invention relates to a signal sensitive regenerative switch, for quieting a radio receiver except in the presence of signal, to effect silence between data transmissions.

In many applications, and particularly in single sideband communications receivers, there is a need for variable signal level response control. In existing systems for quieting receivers, there is a wide variation in the control cut-in and cut-out levels of the receiver in response to signal. In many cases the differential between the cut-in and cut-out points may be in the order 20 db or more, and such operation could sacrifice important data reception which renders these systems unsatisfactory for many purposes. The present system results in a differential between cut-in and cut-out levels of approximately 2 db.

Briefly, this invention utilizes a regenerative amplifier for energizing a PNPN semiconductor switch which ultimately controls the operating bias of the audio circuitry of the receiver. A signal in excess of a predetermined magnitude is amplified through two low gain amplifier stages, and regenerative feedback from the second stage to the first stage causes a rapid build-up in the gain of the first stage to rapidly provide the required large control voltage for the switch. After amplification, the switch output voltage is used to perform the necessary control functions; that is, to turn on or off the power supply for the audio amplifier.

The primary object of this invention is to provide an electronic signal sensitive regenerative switch.

Another object of this invention is to provide a signal sensitive regenerative switch for quieting an audio amplifier between desired signal transmissions, the switch functioning as a trigger to provide sharp cut-in action with slightly delayed cut-out action.

For further objects and for a more detailed explanation of the precise nature of this invention, reference should be made to the following specification and to the accompanying drawing in which the single figure represents a preferred embodiment of the invention as used in conjunction with an audio amplifier.

The system illustrated includes a regenerative switch 10 used for contorlling an audio amplifier 12. As will be seen, the output voltage of the regenerative switch 10 is the power supply for the amplifier 12, and the power supply is cut on and off in the presence or absence of signal.

The regenerative switch 10 includes a first-stage amplifier comprising an NPN-type transistor 16 having a base 18, an emitter 20, and a collector 22. The collector 22 of transistor 16 is connected through a resistor 24 and a voltage regulator 26 to the positive side of a battery 28, or other convenient power source. The emitter 20 is connected to the grounded side of the battery 28 through degenerative impedances including an emitter-resistor 30 and a resistor 32 by-passed for alternating currents by a capacitor 34. The current flowing through the resistors 30 and 32 develop degenerative, or negative feedback voltages, reducing the gain of the transistor 16. Base bias is provided by means of a connection of the base 18 to the junction 35 of voltage dividing resistors 36 and 38.

Signal input, applied between the terminals 40 and 42, is derived from the resistor 44 by means of a movable tap 46, and applied to the base 18 through a coupling capacitor 48. Signal output is derived from the collector 22 and applied through a coupling capacitor 50 to a voltage-doubling network 51 include a diode 52, a diode 54, and a capacitor 56. The output from the doubler 51 is then applied to a second-stage amplifier including an NPN-type transistor 58 having a base 60 connected to the diode 52, a collector 62 connected to the voltage regulator 26, and an emitter 64 connected to the grounded side of the battery 28 through resistors 66 and 68 and through a semiconductor diode 70. The diode 70 is conventional and exhibits impedance characteristics which vary in inverse relation to applied current. A regenerative feedback connection is made from the junction 72 of resistor 68 and the diode 70 to the emitter 20 of transistor 16 through a capacitor 74.

The emiter-follower output from the transistor 58 is derived from the junction 76 of resistors 66 and 68 and is used to trigger a bistable PNPN semiconducting switch 78, otherwise known as a silicon controlled switch or a trigistor. The bistable switch 78 has characteristics which approximate the circuit function of a flip-flop or bistable multivibrator. The elements of the device are illustrated schematically as having a control electrode 80, an emitting electrode 82, and a collecting electrode 84. The PNPN switch 78 is the equivalent of a circuit using NPN and PNP transistors combined into a single PNPN diffused silicon structure, the collector of each being connected to the base of the other. The emitter electrodes of the PNP and NPN transistors are the equivalent of the electrodes 84 and 82, respectively, and the connection of the collector of the PNP transistor to the base of the NPN transistor constitutes the control electrode 80. For a better understanding of the nature of the PNPN switch 78, reference may be made to Bulletin D410–02, 10–59, a publication of Solid State Products, Inc., Salem, Massachusetts; however, for the purposes of this specification, it suffices to point out that PNPN switch 78 will conduct at saturation upon the application of a positive voltage to the control electrode 80, and will continue conducting at saturation until cut off by the application of a negative voltage, or until the positive voltage is removed and a back bias is applied to the electrode 82. In a practical system such as described here, a power level of about 20 db is required to drive the PNPN switch 78 from on to off and from off to on. Rise time is about 0.4 microsecond and fall time is about 1.0 microsecond.

For triggering on the PNPN switch 78, control electrode 80 is connected to the junction 76 of resistors 66 and 68, but this junction will be at a ground potential unless transistor 58 is conducting. The collecting electrode 84 of the PNPN switch 78 is connected to one side of the battery 28 through a resistor 86 and a diode 88, while the emitting electrode 82 is connected to a Zener diode 90. The Zener diode is back biased at its breakdown point by a connection to the regulator 26 through a resistor 91, and thus, a back bias is established at the emitting electrode 82 to maintain the PNPN switch 78 cut off except when a positive pulse of sufficient magnitude is applied to the control electrode 80 to overcome the back bias. As will be seen, a resistor 89 is connected across the PNPN switch 78, the resistor 86, and the diode 90 by means of a manual switch 92 for the purpose of defeating its quieting effect in the absence of signal.

The voltage output from the switch 78 is derived from the junction 93 and provides the bias for the base 94 of a transistor 96 having a collector 98 and an emitter 100. The emitter 100 is connected to the battery 28 through a resistor 102 while the collector 98 is connected to ground through a capacitor 104 across which a Zener diode 106 is connected.

In the operation of the system as thus far described, signal applied at the terminals 40 and 42 is coupled to the first-stage transistor 16 through the capacitor 48. The adjustment provided by the movable tap 46 provides the means for setting the threshold level of operation of the system. Until the signal input exceeds the established threshold, the gain of transistor 16 is low and the output is not sufficient to drive transistor 58 into useful conduction. The voltage output of transistor 16 is rectified by means of the voltage doubler 51 and then D.-C. amplified in the second-stage transistor 58.

The combined gain of the first and second-stage transistor amplifiers 16 and 58 must be sufficient to trigger the device 78 at the established input signal threshold. The gain on transistor 16 is established by the value of the degenerative impedance, i.e., emitter-resistor 30, such that voltages below the input signal threshold level are insufficient to drive the transistor 58 into a state of useful conduction. However, when signal level increases to exceed the established threshold, the transistor 58 is driven into low conduction, and current flows in the emitter load comprising the resistors 66 and 68 in series with the diode 70.

The diode 70 in series with the capacitor 74 provides a reactive shunt on the impedances in the emitter circuit of transistor 16 and the impedance of the shunt is governed by the instantaneous resistance value of the diode 70 in series with the capacitor 74. Since the impedance of diode 70 varies in inverse relation to the current flow through it, even a small increase in current flow through diode 70 reduces its resistive impedance, and hence the capacitive shunt across the emitter-resistor 30 is increased. An increase in the capacitive shunt increases the gain of transistor 16 and further drives the transistor 58 and the diode 70, further reducing the diode impedance, and this action continues until the impedance is reduced to a very small value, perhaps 40 ohms. Thus, the action of the circuit is regenerative to essenitally a full gain condition so that once the signal input exceeds the established threshold, the gain of the transistor 16 is regenerated through an amplifier gate action from the order of perhaps 15 db to full gain of 40 db, and this result occurs very rapidly. This regenerated action impresses sufficient drive on the switch 78 to overcome the back bias established by the Zener diode 90, and thus the switch 78 snaps from a cut-off to a full-on status, in response to an input signal having a level in excess of the established threshold.

When the switch 78 conducts, the voltage on the base 94 of the NPN-type transistor 96 moves down towards the collector voltage, thereby driving the transistor 96 into conduction at or near saturation, thus establishing at the junction 107 of the collector 98 and the Zener diode 106 a voltage equal to the breakdown voltage of the Zener diode. When the input signal diminishes below the threshold level, transistor 58 is shut off, thereby removing the forward bias on the control electrode 80. Since the emitting electrode 82 is back biased by the Zener diode 90, the switch 78 rapidly turns off, thereby again moving the voltage on the base 94 of transistor 96 away from the collector voltage and shutting down conduction through that transistor. Upon this occurrence, the voltage at the collector 98 is reduced to zero. In a practical system, the switch device 78, which ordinarily required about 20 db change in input signal, was driven from on to off with as little as a 2 or 3 db change in signal level at terminals 40 and 42. This differential of 2 to 3 db was advantageous in avoiding flutter due to very small signal level changes for input signals just at the threshold level.

The amplifier 12 comprises a single-stage transistor 108 having a base 110, an emitter 112, and a collector 114. Base bias is established by means of a connection to the junction 116 of voltage-dividing resistors 118 and 120 connected between the junction 107 and ground. The emitter electrode 112 is connected to the junction 107 through resistors 122 and 124, the resistor 124 being bypassed for alternating currents by means of a capacitor 126. The collector 114 is connected to ground through a semiconducting diode 128 and a resistor 130. Audio input is applied from terminal 132 through capacitor 134 and resistor 136 to the base 110, while signal output is derived at the terminal 138 through a capacitor 140.

When the breakdown voltage of Zener diode 106 is established at the junction 107, the transistor 108 is operatively biased so that upon the application of the input signal to the terminal 132, an amplified output will be derived at terminal 138. It will be noted that this condition can occur only when the semiconductor switch 78 is conducting so as to cause conduction of the transistor 96 and the establishment of the breakdown voltage at Zener diode 106. Therefore, in the absence of a signal in excess of the threshold level applied at the terminals 40 and 42 of the regenerative switch, no signal will pass through the transistor 108 for amplification.

The following parameters, representing a system actually reduced to practice, are listen below for the purpose of enabling persons skilled in the art to reproduce this invention.

| | |
|---|---|
| Transistors: | |
| 16 | Type 2N335. |
| 58 | Type 2N335. |
| 96 | Type 2N329A. |
| 108 | Type 2N270. |
| PNPN switch 78 | Type 3C30. |
| Diodes: | |
| 52 | Type 1N456A. |
| 54 | Type 1N456A. |
| 70 | Type 1N252. |
| 88 | 5 volt Zener. |
| 90 | 2 volt Zener. |
| 106 | 16 volt zener. |
| 128 | Type 1N456A. |
| Battery 28 | 26 volts. |
| Resistors: | |
| 24 | 33K ohms. |
| 30 | 330 ohms. |
| 32 | 820 ohms. |
| 36 | 12K ohms. |
| 38 | 3.9K ohms. |
| 44 | 1K ohm. |
| 66 | 330 ohms. |
| 68 | 2.2K ohms. |
| 86 | 5.6K ohms. |
| 90 | 5.6K ohms. |
| 91 | 10K ohms. |
| 102 | 330 ohms. |
| 118 | 2.7K ohms. |
| 120 | 10K ohms. |
| 122 | 560 ohms. |
| 124 | 3.3K ohms. |
| 130 | 5.6K ohms. |
| 136 | 15K ohms. |
| Capacitors: | |
| 34 | 2.2 $\mu$f. |
| 48 | .47 $\mu$f. |
| 56 | 10 $\mu$f. |
| 74 | 100 $\mu$f. |
| 104 | 15 $\mu$f. |
| 126 | 23 $\mu$f. |
| 134 | 1.5 $\mu$f. |
| 138 | .047 $\mu$f. |

It is to be understood that the foregoing parameters are by way of example only and should not be considered as limiting this invention. In fact, while the system incorporating these parameters was found to be successful, the parameters may not have been optimized, and improved or modified performance can be obtained by circuit adjustments. It will also be apparent that many modifications and adaptations will be available to persons skilled in the art without departure from the scope of this invention. For example, the voltage developed at the output of the regenerative switch may be used to control a relay or to control the grid or base bias of a tube or transistor. In addition, the voltage regulator 26 is not necessary for the satisfactory performance of the regenerative switch but was used in the embodiment as reduced to practice because such a source was conveniently available. Moreover, other types of bistable switches, other than the PNPN device 78, may be used. Accordingly, it is intended that this invention be limited only by the annexed claims as interpreted in the light of the prior art.

What is claimed is:

1. In a signal responsive regenerative switch, the combination comprising:

a source of signals;

a signal amplifier for amplifying said signals, said signal amplifier including a degenerative impedance for degenerating the gain of said amplifier, whereby said amplifier is biased for low gain;

a current flow control device having a load, said device being normally biased for non-conduction, and being biased into conduction through said load in response to a given level of signal output from said signal amplifier, said conduction through said load generating an output voltage;

a bistable device normally biased into one state, and being biased into a second state upon the application of said output voltage;

and additional means responsive to conduction through said current flow control device for regenerating the gain of said signal amplifier, whereby said output voltage is rapidly increased to a maximum magnitude for rapidly changing the state of said bistable device.

2. The invention as defined in claim 1 wherein said additional means comprises a variable impedance connected in series with said current flow control device and in shunt with said degenerative impedance, said variable impedance having characteristics such that its impedance varies in inverse relation to the current flow therethrough.

3. The invention as defined in claim 2 wherein said variable impedance is a semiconducting diode.

4. The invention as defined in claim 1 wherein said bistable device is a PNPN semiconducting switch.

5. In a signal responsive regenerative switch, the combination comprising:

a source of signals;

a signal amplifier for amplifying said signals, said amplifier being normally biased for low gain, said signal amplifier including a degenerative impedance for establishing said low gain of said amplifier;

rectifier means for developing a direct voltage from said amplified signals;

a current flow control device having a load, said device being normally biased for non-conduction, and being biased into conduction through said load by the application of said direct voltage, said conduction through said load generating a load voltage;

a bistable device being normally biased into one state in the absence of said load voltage, and being biased into a second state upon the application of said load voltage;

and additional means responsive to conduction through said current flow control device for regenerating the gain of said signal amplifier, whereby said direct voltage is rapidly increased to a maximum magnitude for rapidly changing the state of said bistable device.

6. The invention as defined in claim 5 wherein said additional means comprises a variable impedance connected in series with said current flow control device and in shunt with said degenerative impedance, said variable impedance having characteristics such that its impedance varies in inverse relation to the current flow therethrough.

7. The invention as defined in claim 6 wherein said variable impedance is a semiconducting diode.

8. The invention as defined in claim 5 wherein said rectifier means comprises a voltage doubler.

9. The combination comprising:

an alternating current signal source;

a direct voltage source;

a first amplifier comprising a first current flow control device having an input electrode, an output electrode, and a common electrode;

alternating current connections from said signal source across said input and common electrodes;

direct current biasing connections from each of said electrodes to said direct voltage source for rendering said first device non-conductive in the absence of applied signal above a predetermined threshold level, said connections including an output impedance connected to said output electrode and a negative feedback impedance connected to said common electrode;

a second amplifier comprising a second current flow control device having an input electrode, an output electrode, and a common electrode;

rectifier means connecting the output and common electrodes of said first device across the input and common electrodes of said second device;

direct current biasing connections from each of said electrodes of said second device to said direct voltage source for rendering said second device non-conductive in the absence of a rectified voltage applied across said input and common electrodes, said connections including a load impedance in series with a variable impedance, said variable impedance having characteristics such that its impedance decreases with increases in direct current flow therethrough, said load impedance and said variable impedance being connected to said output electrode; and an alternating current connection connecting said variable impedance in shunt with said negative feedback impedance, whereby signals above said predetermined threshold render said first and second devices conductive, thereby reducing the impedance of said variable impedance and shunting said negative feedback impedance for alternating currents, thereby increasing the signal gain of said first amplifier.

10. The invention as defined in claim 9 wherein said variable impedance is a semiconductor diode.

11. The invention as defined in claim 9 and a bistable switch, said switch being normally non-conductive, and means responsive to conduction through said second current flow control device for rendering said switch conductive.

12. The invention as defined in claim 11 wherein said variable impedance is a semiconductor diode.

13. The invention as defined in claim 9 wherein each of said first and second current flow control devices is a transistor.

14. The invention as defined in claim 13 and a bistable switch having input electrodes, said bistable switch being non-conductive in the absence of a direct voltage applied across said input electrodes, and a direct current connection from said load resistor across said input electrodes of said switch, whereby said switch is rendered conductive when said signals from said source exceed said predetermined threshold level.

15. The invention as defined in claim 14 wherein said variable impedance is a semiconductor diode.

References Cited by the Examiner

UNITED STATES PATENTS

| | | | |
|---|---|---|---|
| 2,904,678 | 9/59 | Malchow. | |
| 2,930,890 | 3/60 | Lenk | 325—478 X |
| 2,972,684 | 2/61 | Elliott et al. | 307—88.5 |
| 3,056,086 | 9/62 | Brauner | 325—478 X |
| 3,079,558 | 2/63 | Spencer | 325—478 X |

FOREIGN PATENTS

| | | |
|---|---|---|
| 716,543 | 10/54 | Great Britain. |

OTHER REFERENCES

Pub. II, Shaughnessy, "The Zener Diode," Popular Electronics, June 1961 (page 81 relied on).

Pub. I, Solid State Product Bulletin D410-02, March 1960 (page 3 relied on).

ARTHUR GAUSS, *Primary Examiner.*